(12) United States Patent
Male (10) Patent No.: US 6,229,733 B1
(45) Date of Patent: May 8, 2001

(54) NON-VOLATILE MEMORY CELL FOR LINEAR MOS INTEGRATED CIRCUITS UTILIZING FUSED MOSFET GATE OXIDE

(75) Inventor: Barry Male, W. Granby, CT (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/475,814

(22) Filed: Dec. 30, 1999

Related U.S. Application Data (60) Provisional application No. 60/126,106, filed on Mar. 24, 1999.

(51) Int. Cl.[7] ................................................ G11C 16/04
(52) U.S. Cl. ........................ 365/185.18; 365/96; 365/104
(58) Field of Search ....................... 365/104, 96, 185.18, 365/185.28, 94, 185.01

(56) References Cited

U.S. PATENT DOCUMENTS

| | | | |
|---|---|---|---|
| 4,173,766 | * 11/1979 | Hayes | 257/315 |
| 4,507,756 | 3/1985 | McElroy | 365/104 |
| 4,507,757 | 3/1985 | McElroy | 365/104 |
| 4,742,491 | 5/1988 | Liang et al. | 365/218 |
| 4,884,239 | 11/1989 | Ono et al. | 365/185 |
| 5,086,331 | 2/1992 | Hartgring et al. | 357/51 |
| 5,241,496 | 8/1993 | Lowrey et al. | 365/96 |
| 5,258,947 | 11/1993 | Sourgen | 365/96 |
| 5,291,434 | 3/1994 | Kowalski | 365/96 |
| 5,469,384 | 11/1995 | Lacey | 365/185.13 |
| 5,506,431 | 4/1996 | Thomas | 368/185.15 |
| 5,581,504 | 12/1996 | Chang | 365/185.17 |
| 5,646,438 | 7/1997 | Frerichs | 257/530 |
| 5,812,448 | * 9/1998 | Wen | 365/182 |
| 5,995,409 | * 11/1999 | Holland | 365/149 |

* cited by examiner

Primary Examiner—David Nelms
Assistant Examiner—Hoai V. Ho
(74) Attorney, Agent, or Firm—Weingarten, Schurgin, Gagnebin & Hayes LLP (57) ABSTRACT

A non-volatile memory cell comprising a metal oxide semiconductor field effect transistor (MOSFET) fabricated to read back a logic level "one" state and programmable by a gate to drain fusing to read back to a logic level "zero" state. The drain is patterned to enhance the formation of a localized hot spot during device lateral NPN transistor snapback for a controlled meltdown of gate oxide and the creation of an ohmic gate to drain path. A metal oxide semiconductor (MOS) integrated circuit typically includes a plurality of memory cells composing a programmable array. The drains of each memory cell are tied together in parallel and connected to a high-level programming voltage, and the sources are tied to ground. Each memory cell further comprises a series pair of switches for connecting a low-level bias voltage to the gate for cell programming and for connecting a bias current to the gate for cell read-back, and a parallel pair of switches for shunting the gate to the source to inhibit cell programming.

19 Claims, 7 Drawing Sheets

NON-VOLATILE MEMORY CELL FOR LINEAR MOS INTEGRATED CIRCUITS UTILIZING FUSED MOSFET GATE OXIDE

CROSS REFERENCE TO RELATED APPLICATIONS

This application claims priority under 35 U.S.C. §119(e) of U.S. Provisional Application No. 60/126,106, filed Mar. 24, 1999; the disclosure of which is hereby incorporated by reference.

STATEMENT REGARDING FEDERALLY SPONSORED RESEARCH OR DEVELOPMENT

N/A

BACKGROUND OF THE INVENTION

This invention relates generally to non-volatile memory cells and, more particularly, to a non-volatile memory cell for a linear metal oxide semiconductor (MOS) integrated circuit.

Precision performance by a linear MOS integrated circuit is typically accomplished by internally trimming the circuit currents and voltages. Conventional trimming techniques are performed as part of the manufacturing process and must be permanent so that the trimming does not change when power is removed from the circuit. Several techniques use a fuse-based technology, such as the metal spike shorting of the emitter-base junction of a NPN transistor, or the opening of metal or thin film links, that require high current pulses to sever the subject material. Another method requires specialized equipment for the laser trimming of thin film links or the vernier trim of thin film resistor tabs, which may drift over time. All of these techniques are intended for low-density memory applications. High-density storage techniques use either "anti-fuse" technology or place a long-term charge storage on the MOSFET gates. These techniques, however, add complex processing steps to wafer fabrication and extra cost to the device.

What is needed, therefore, is an inexpensive and user-programmable technique for performing a parametric trim of a linear MOS integrated circuit.

BRIEF SUMMARY OF THE INVENTION

In accordance with the invention, a non-volatile memory cell comprises a metal oxide semiconductor field effect transistor (MOSFET) fabricated to read back a logic level "one" state and programmable by a gate to drain fusing to read back to a logic level "zero" state. The MOSFET drain has a blunted and notched "V" shape to enhance the formation of a localized hot spot during lateral NPN transistor snapback for a controlled meltdown of gate oxide and the creation of an ohmic gate to drain path. The MOSFET gate oxide is also made thick enough to achieve snapback upon application of a gate bias voltage without gate oxide rupture.

A metal oxide semiconductor (MOS) integrated circuit typically includes a plurality of memory cells composing a programmable array. The MOSFET drains of each memory cell are tied together in parallel and connected to a high-level programming voltage, and the MOSFET sources are tied to ground. Each memory cell may further comprise a series pair of switches connecting a low-level bias voltage to the MOSFET gate for cell programming based on "snapback selectivity" and connecting a bias current to the MOSFET gate for cell read-back, and a parallel pair of switches shunting the gate to the source to inhibit cell programming. The array may be user-programmed to selectively engage parametric elements distributed throughout a linear MOS integrated circuit and thereby accomplish a parametric trim of the circuit for precision performance in an intended application.

BRIEF DESCRIPTION OF THE SEVERAL VIEWS OF THE DRAWING

The invention will be more fully understood by reference to the following Detailed Description of the Invention in conjunction with the drawings, of which.

FIG. is a block diagram of a linear BiCMOS integrated circuit incorporating a programmable array of non-volatile memory cells in accordance with the invention.

DETAILED DESCRIPTION OF THE INVENTION

Figure 1:
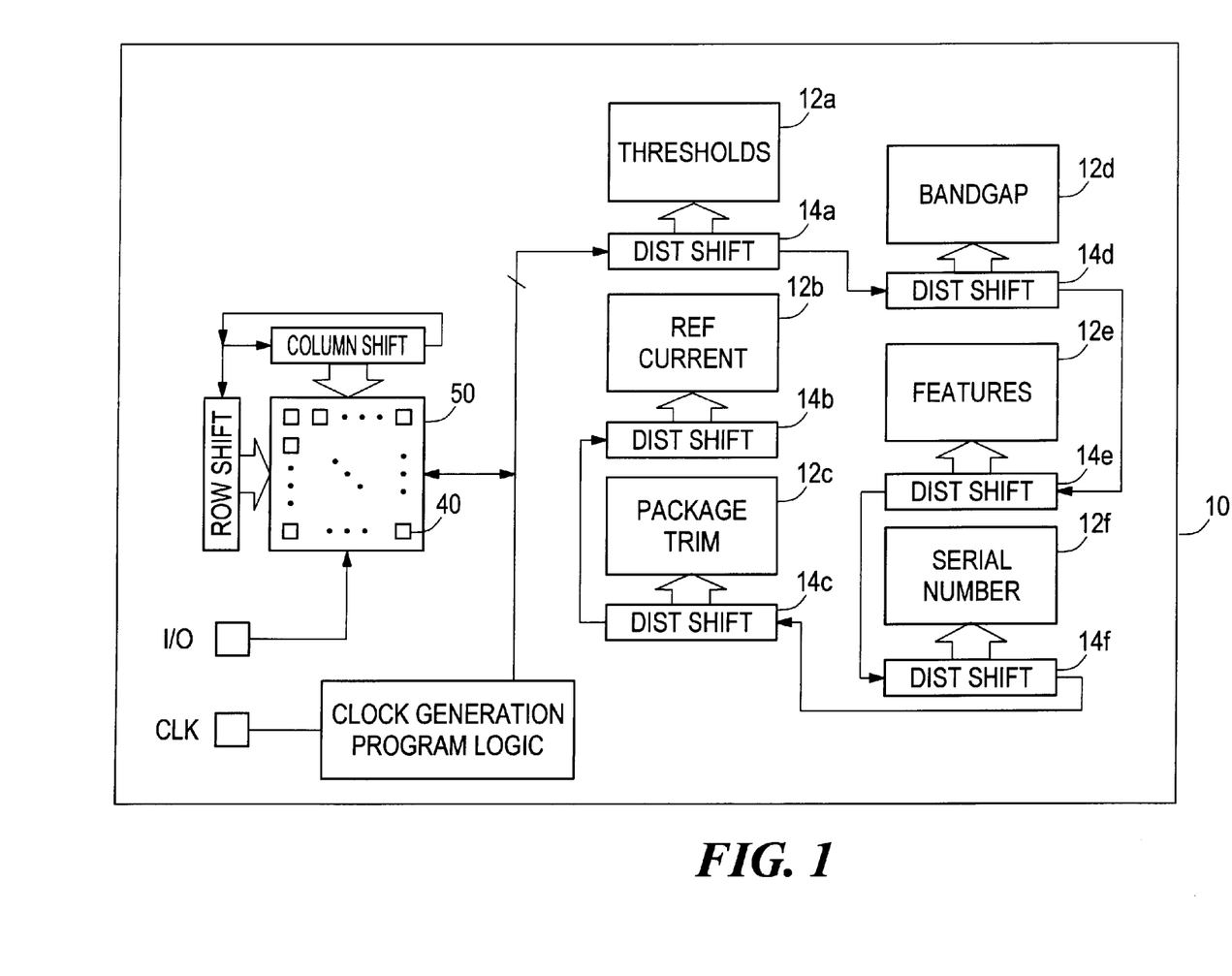

A bipolar complementary oxide semiconductor (BiCMOS) linear integrated circuit 10 incorporating the invention is illustrated in FIG. 1. The circuit 10 comprises a plurality of blocks 12a–12f, or modules, each performing a part of a linear function, such as a digital-to-analog conversion. To achieve the most accurate output, each block typically requires a permanent and precise trimming of internal voltages and currents. This trimming is accomplished by a one-time programming of the appropriate non-volatile (NV) memory cells 40 of a cell array 50 and a power-up serial distribution of the array contents to distribution or holding registers 14a–14f associated with the blocks 12a–12f of the circuit 10.

Figure 2A:
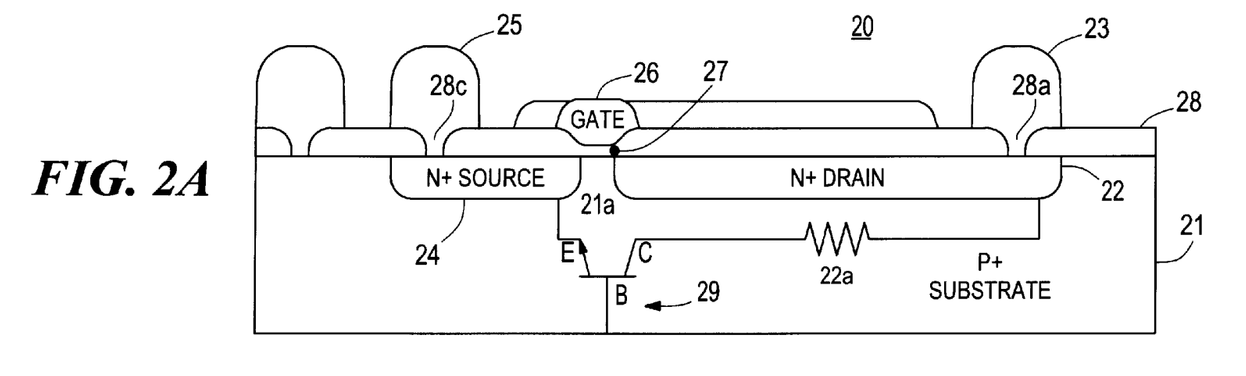
FIG. 2A is a cross sectional view of a MOSFET of a memory cell of the array of the circuit of FIG. 1 having fused gate oxide and its lateral NPN parasitic.
Figure 2B:
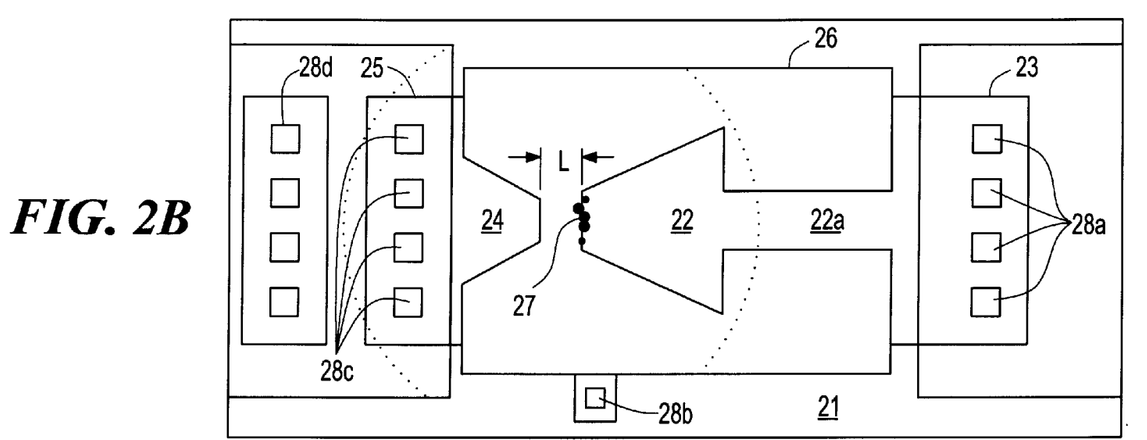
FIG. 2B is a topological view of the MOSFET of FIG. 2A having fused gate oxide.

Each memory cell 40 includes a metal oxide semiconductor field effect transistor (MOSFET) device. A cross-sectional view of an n-type metal oxide semiconductor field effect transistor (MOSFET) 20 and its parasitic lateral NPN transistor 29 is illustrated in FIG. 2A and a topological view of the MOSFET 20 is illustrated in FIG. 2B. The MOSFET 20 is comprised of a substrate 21, a drain region 22 and source region 24. The drain 22 and source 24 are diffused into the substrate 21 and are separated by a channel 21a in the substrate 21. The drain 22 preferably has a ballast resistance 22a of approximately 130–150 ohms to limit the drain current during cell programming. The drain ballast resistance 22a serves to equalize the drain currents of MOSFET devices that are connected in parallel. A polysilicon gate 26 is deposited partially into an insulating oxide layer 28 and directly above the channel 21a. That portion of the insulating oxide layer 28 directly beneath the gate 26 is referred to as gate oxide while the remainder of the oxide layer 28 is referred to as field oxide. The insulating oxide layer 28 has openings 28a, 28b, 28c, 28d above the drain 22, gate 26, source 24, and substrate 21, respectively. Metal traces 23, 25 contact the drain 22 and source 24 through the openings 28a, 28c, respectively, and provide connectivity to other devices or external circuitry (not shown).

Gate-to-channel oxide breakdown, or rupture, is well known in the art and considerable attention has been given to avoiding a breakdown, or minimizing the damage caused by a breakdown, in a conventional MOSFET by maximizing its hardness to electrical overstress (EOS), such as electrostatic discharge (ESD). In particular, a breakdown may occur when a sufficiently high energy/voltage pulse is applied to the gate so as to cause the parasitic lateral transistor to go into an "avalanche" condition. The current continues to increase until a voltage fold-back phenomena called lateral NPN transistor "snapback" occurs. Within a few micro-seconds hot spots form at the gate-drain edge causing degradation of the gate oxide and essentially destroying the device by shorting the gate to the drain, source or substrate.

The present invention uses this phenomenon advantageously for efficient and permanent electrical programming on a linear MOS integrated circuit. The insulating oxide layer 28 of the present MOSFET is made thick enough, typically 400–600 angstroms, to support a drain-to-gate voltage high enough to achieve lateral NPN transistor snapback without rupturing the insulating oxide layer 28. In addition, the drain 22 has a blunted "V" shape to facilitate the creation of at least one pinpoint micro furnace when a programming voltage is applied to the drain 22. The microfurnace produces a hot spot 27 reaching a temperature over 1000 degrees Celsius, preferably 1500 degrees Celsius. If a programming voltage is maintained for a sufficient duration, approximately 100 milli-seconds, the insulating oxide layer 28 in the vicinity of the hot spot 27 chemically changes from an insulator to a glassy conductor to thereby create an ohmic path between the gate 26 and the drain 22. Depending on the duration of the applied programming voltage, several hot spots may be created on the channel edge of the drain so that the resulting gate-to-drain resistance is relatively low, typically less than 500 k ohms.

The ohmic path is a permanent breakdown of the insulating oxide layer 28. When the drain 22 is grounded and a bias current is injected into the gate 26, a voltage below the threshold for a logic "one" level, typically 2.4 volts for 5 volt logic, is developed at the gate 26. For example, a 10 micro-ampere bias current flowing through an approximately 4K ohmic path produces a 40 millivolt gate voltage.

The channel pattern should be kept to the process minimum feature size to, inter alia, maximize the lateral NPN transistor beta and the hot electron effects, and minimize the required voltage applied for cell programming. Typical dimensions for the channel are a 2 micron width and a 3 micron length. The source channel edge is preferably narrow, typically 2 microns. The bottom end of the "V" shaped drain is preferably blunted to produce a wide drain channel edge, typically 3–4 microns. The wide drain channel edge facilitates multiple parallel hot spots that help to increase the programming yield. The "V" shaped drain is also notched through the upper portion to produce the ballast resistance region 22a. The ballast resistance regulates the drain current, typically to about 40 milli-amperes, and ensures a uniform distribution of drain current from cell to cell. The drain current, in turn, controls the rate of temperature rise at the channel edge of the drain and the radius of the hot spot.

Figure 3:
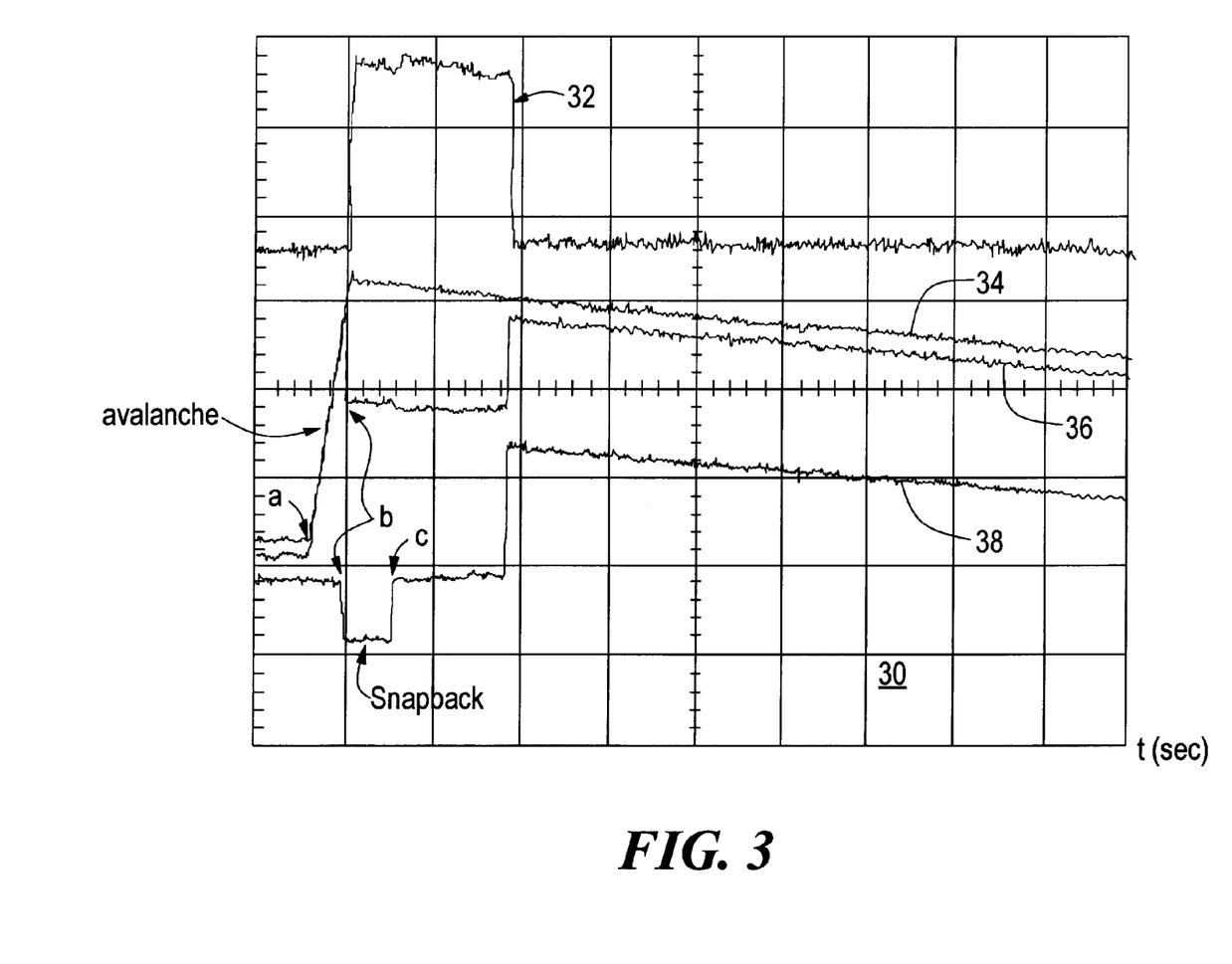
FIG. 3 is a plot of drain current and drain voltage for the MOSFET of FIG. 2 during cell programming.

FIG. 3 is a plot 30 of a programming current 32, a programming voltage ($V_P$) 34, the drain voltage 36 and the gate voltage 38 during cell programming. A bias voltage ($V_B$), typically 5 volts, is applied to the gate 26 to enable the cell for programming. The programming voltage ($V_P$), typically 15 volts, is then applied to the drain to bring the parasitic lateral NPN transistor 29 into avalanche at point 'a'. When the current density reaches point 'b', voltage snapback occurs. During snapback there is a significant power dissipation in the channel 21a and the temperature of the device continues to rise in the vicinity of the hot spot 27 until the oxide melts down at point 'c' to create the ohmic path between the gate 26 and the drain 22.

It is the application of the bias voltage to the gate 26 of a particular cell that results in a "snapback selectivity" wherein only a biased cell is fused despite the fact that the programming voltage is applied to the drain 22 of every cell in the array during programming. The bias voltage reduces the level of the voltage that must be applied to the drain 22 to cause parasitic lateral NPN transistor snapback. Thus, while the biased cell achieves snapback, the other array cells are unaffected because the level of the programming voltage is inadequate to produce the drain current density necessary for snapback.

Figure 4:
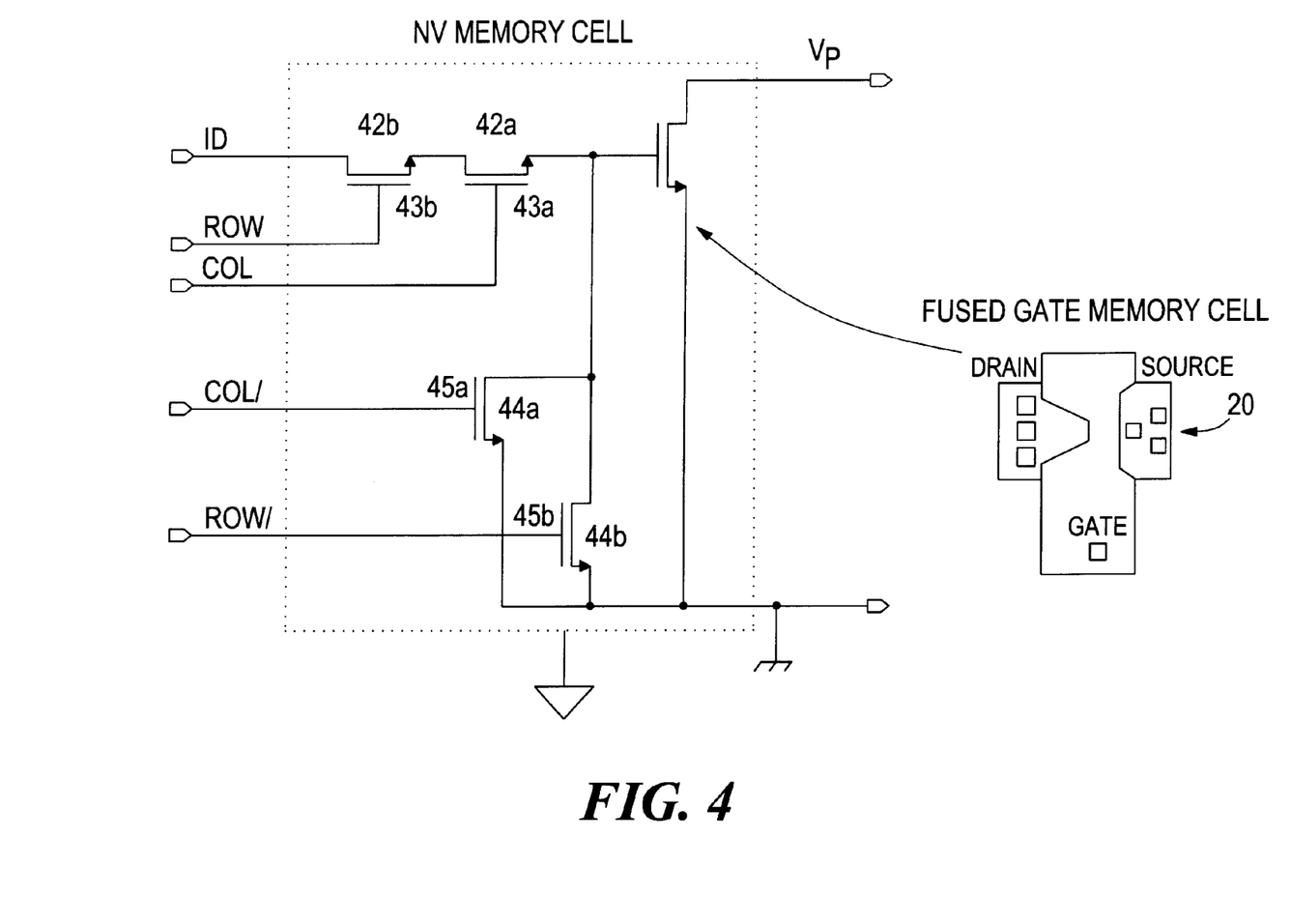
FIG. 4 is an electrical diagram of a non-volatile memory cell of the array of the circuit of FIG. 1 comprising a MOSFET, a row FET and a column FET.

FIG. 4 is an electrical diagram of the non-volatile memory cell. In addition to the MOSFET 20, each cell 40 also includes a serial pair of signal switching devices, field effect transistors (FET) 42a, 42b, and a parallel pair of shunt switching devices, FETs 44a, 44b. As described below, column and row control signals (COL, COL/, ROW, ROW/) are applied to the gates 43a, 45a, 43b, 45b of the signal FETs 42a, 42b and shunt FETs 44a, 44b, respectively, to select a particular cell for programming. The signal switching devices are used either to apply the bias voltage to the MOSFET gate 26 during programming, or to connect the cell to a holding register 14 (FIG. 1) during power-up read back. The shunt switching devices are used to inhibit cell programming by shunting the MOSFET gate 26 to the ground potential of the MOSFET source 24.

Figure 5:
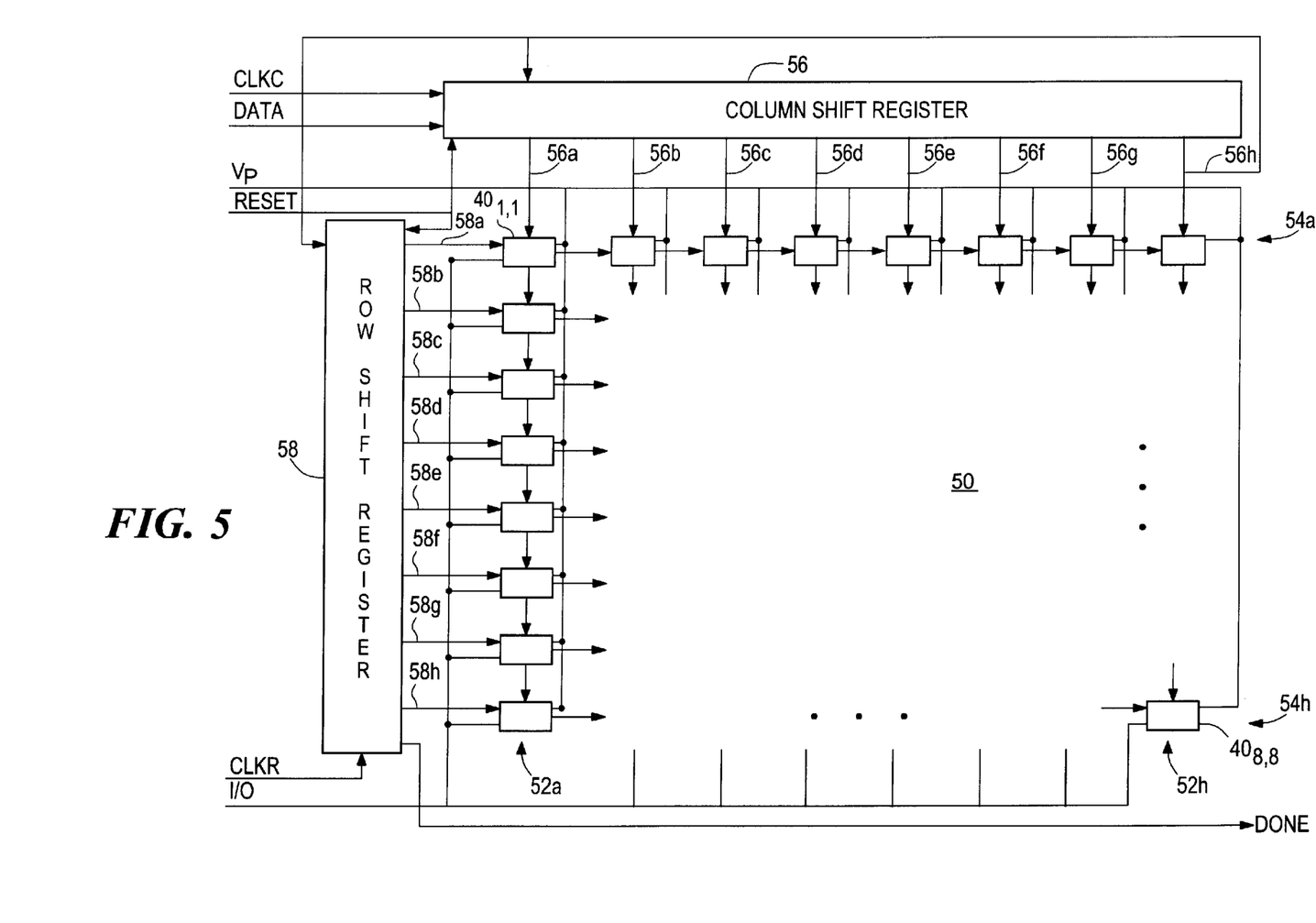
FIG. 5 is an electrical diagram of an eight by eight array of non-volatile memory cells.

FIG. 5 is an electrical diagram of a sixty-four cell array 50. The cells $40_{C,R}$ are arranged in eight columns 52a–52h by eight rows 54a–54h. It should be appreciated that smaller or larger sized arrays may be implemented. In an array programming mode, the drain 22 of each cell 40 is connected to the common programming voltage, $V_P$, while in an array read back mode the drains are connected to ground. The source 24 of each cell 40 is connected to a common ground. As is described below, the gate 26 of all inactive cells are shunted to the grounded source 24, while the gate 26 of the active cell is connected to an I/O line. In the program mode, the I/O line is an input signal, i.e., the applied bias voltage, $V_B$, whereas in the read back mode the I/O line is an output signal, i.e., the voltage developed by a bias current, typically 10 microamperes, applied to the gate 26 of the active cell.

The array 50 also includes a column shift register 56 generating for each column a pair of column control signals, COL and COL/ (not labeled in FIG. 5), connected to the switch gates 43a, 45a of each cell $40_{c,a}$–$40_{c,h}$ in the corresponding column 52a–52h. The array also includes a row shift register 58 generating for each row a pair of row control signals, ROW and ROW/ (not labeled in FIG. 5), connected to the switch gates 43b, 45b of each cell $40_{a,R}$–$40_{h,R}$ in the corresponding row 54a–54h. A reset signal, RESET, is connected to reset pins of the column and row shift registers. A column clock signal (CLKC) and a row clock signal (CLKR) are used to shift a column bit and a row bit, respectively, across the shift register banks 56, 58. A DONE signal changes from a logic level "zero" state to a logic level "one" state when the row bit is shifted out of the last register indicating that each cell in the array has been programmed or read back.

Figure 6:
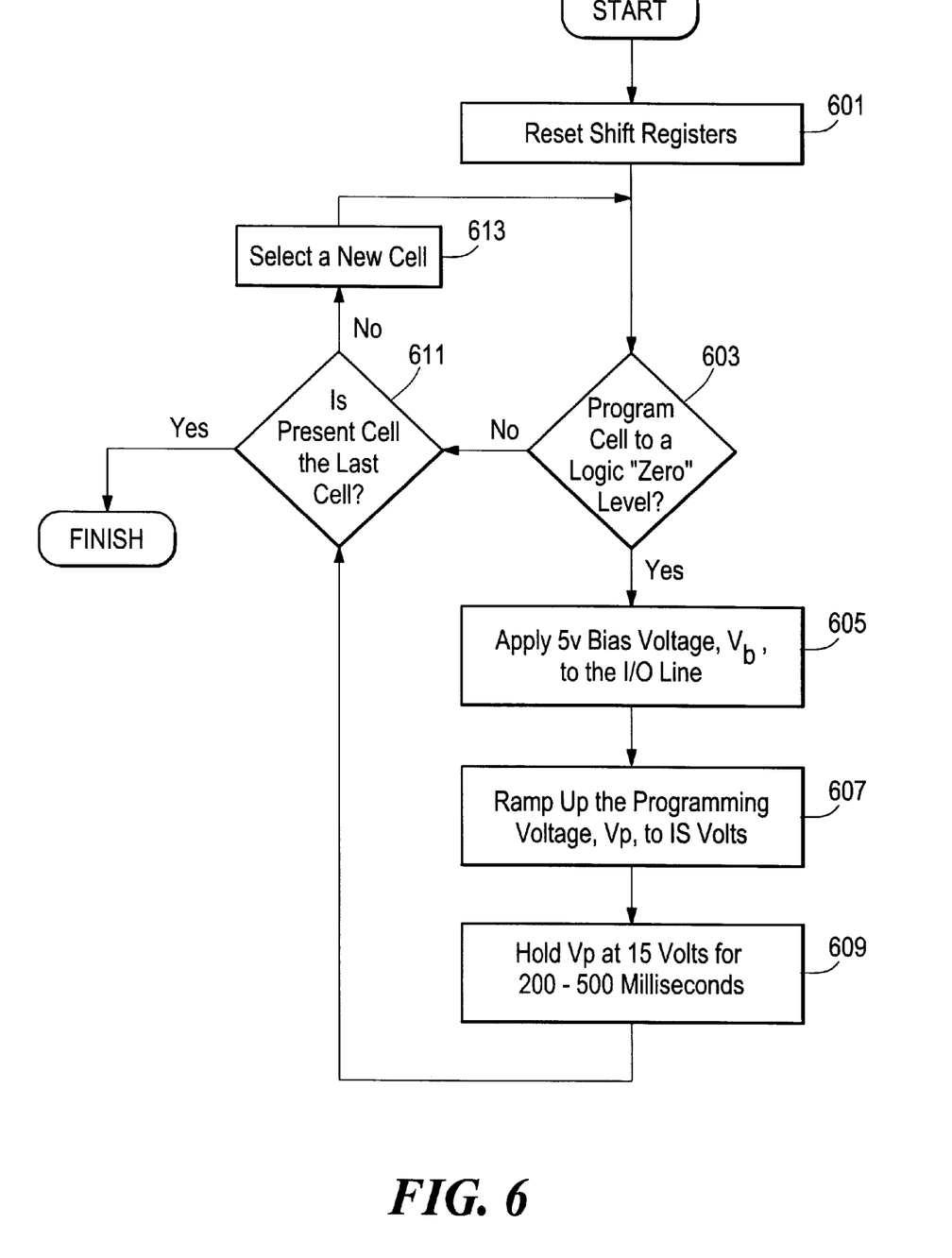
FIG. 6 is a flow diagram of a procedure for programming the array of FIG. 5.

FIG. 6 is a flow diagram of an array programming procedure for the illustrated embodiment. This programming procedure is performed only one time, either as a final step in the manufacturing process, or by a user tailoring the device for a specific application. The programming may be accomplished by a variety of different techniques. For example, custom software may be written to download data and control signals through the parallel port of a personal computer. Alternatively, a commercially available data programmer used to program memory devices, such as the 27256 EPROM family, may be utilized.

At step 601, column shift register outputs 56b–56h are reset so that the COLb–COLh signals (not labeled in FIG. 5) are at a logic level "zero" state, while the first column shift register output 56a is preset so that the COLa signal (not labeled in FIG. 5) is at a logic level "one" state. Also at step 601, row shift register outputs 58b–58h are reset so that the ROWb–ROWh signals (not labeled in FIG. 5) are at a logic level "zero" state, while the first row shift register output 58a is preset so that the ROWa signal (not labeled in FIG. 5) is at a logic level "one" state. Thus, the cell at column a, row a is the first cell to be selected for programming. The MOSFET gate 26 of the cell at column a, row a is connected to the IO signal, while the MOSFET gates of the remaining cells are shunted to the MOSFET source 24.

At decision step 603, it is determined whether the selected cell, i.e., the active cell, is to be programmed to a logic level "zero" state, or is to remain at the fabricated logic level "one" state. If it is determined at decision step 603 that the active cell is not to be programmed to a logic level "zero" state, the procedure moves directly to decision step 611. On the other hand, if the active cell is to be programmed to a "zero" logic level, a logic level "one" state is placed on the I/O line causing the 5 volt bias voltage, $V_B$, to be placed onto the gate 26 at step 605. The programming voltage, $V_P$, on the drain 22 is ramped up from zero to 15 volts, at step 607. At step 609, the programming voltage, $V_P$, is held at 15 volts for a predetermined time, typically 200–500 milliseconds.

As illustrated in FIG. 5, the programming voltage is placed on the drain 22 of each cell. Device selectivity is accomplished by placement of the bias voltage on the gate 26 of the target cell. As described above, the bias voltage produces hot electrons at the drain and lowers the breakdown voltage for the selected device. The heat in the channel 21a causes the gate oxide proximate to the drain openings 28a to meltdown and thereby create an ohmic path, typically less than 500K ohms, between the gate 26 and the drain 22.

At decision step 611, a DONE signal is checked to determine whether all of the array cells have been programmed. If the DONE signal is set, the array programming has finished. If the DONE signal is not set, the column shift register 56 and/or the row shift register 58 are shifted to select a new active cell at step 613. In the present example, the active cell is shifted to the next column so that the cell at column b, row a is the active cell. When the last column, column h, is reached, the active cell is shifted from the cell at column h, row a to the cell at column a, row b. It should be appreciated that the sequence of cell programming is not critical and a variety of different cell shifting procedures may be used to program the array 50. After the new active cell has been selected, the procedure returns back to decision step 603.

Referring back to FIG. 1, the sixty-four bits stored in the cell array are distributed through the circuit 10 each time power is applied. The bits are read serially from the array 50 via the I/O line and shifted through holding shift registers 14a–14f that are assigned to a particular block 12. Serial distribution reduces the silicon area required for interconnections and simplifies the structure of the holding shift registers.

Figure 7:
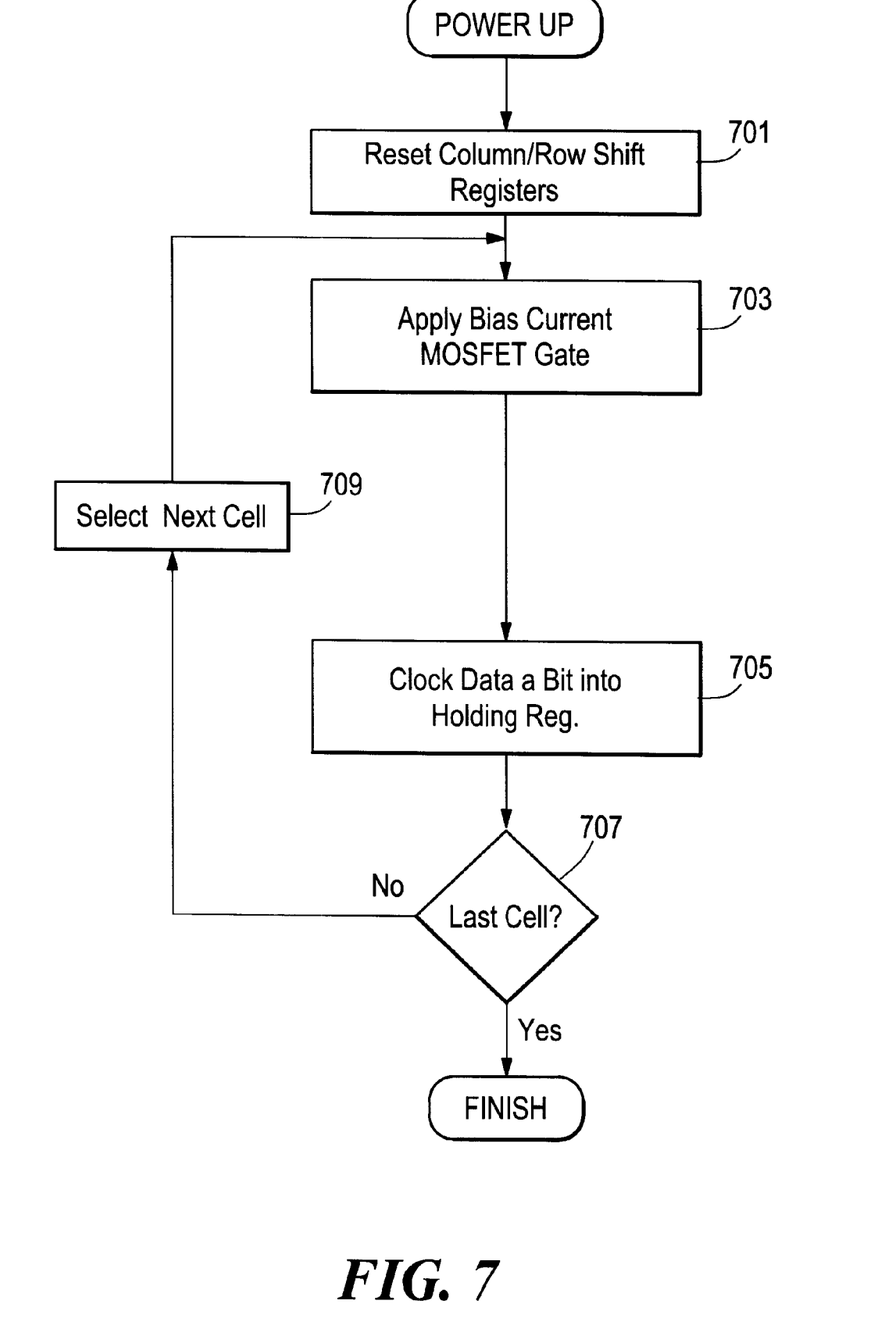
FIG. 7 is a flow diagram of a procedure for read back of the array of FIG. 5.

FIG. 7 is a flow diagram of an array distribution procedure for the illustrated embodiment. This procedure is executed by the integrated circuit each time it is powered up. The contents of the array may also be read back out of the integrated circuit using a personal computer, commercially available data programmer, etc.

At step 701, column shift register outputs 56b–56h are reset to a logic level "zero" state, while the first column shift register output 56a is preset to a logic level "one" state, and row shift register outputs 58b–58h are reset to a logic level "zero" state, while the first row shift register output 58a is preset to a logic level "one" state. Thus, the cell at column a, row a is the first cell to be selected for read back. At step 703, a bias current, typically 10 microamperes, is injected into the gate 26 of the selected cell through the pair of signal switching devices 43a, 43b. The voltage developed at the gate 26 indicates the logic level of the stored bit. A fused MOSFET offers low resistance so that only a very low voltage is developed and the gate 26 reads as a logic level "zero" state. The logic level is clocked into the first location of the serially connected holding shift registers 14a–14f (FIG. 1) at step 705.

At decision step 707, the DONE signal is checked to determine whether all of the array cells have been read. If the DONE signal is set, the read back has finished. If the DONE signal is not set, the column shift register 56 and/or the row shift register 58 are shifted to select a new active cell at step 709. It should be appreciated that the sequence of cell read back is not critical and a variety of different cell shifting procedures may be used to program the array 50. After the new active cell has been selected, the procedure returns back to step 703.

It should be appreciated that a memory cell may alternatively comprise a p-type MOSFET. The use of a p-type MOSFET simply requires voltage potentials that are the inverse of the voltage potentials shown in the illustrated embodiment. The p-type MOSFET consumes more area as each p-type MOSFET requires a well diffusion for substrate isolation.

It should also be appreciated that the memory cells 40 need not be arranged as an array and that an individual cell may be addressed by a variety of methods. In addition, the memory cells may be fully integrated into the circuit blocks 12 so that read back of the cell data for distribution is not necessary. Furthermore, those skilled in the art will recognize that more efficient techniques for programming the array may be employed to support the simultaneous programming of two or more cells. For example, data specifying two or more cells in a particular column or row may be entered into the column and row shift registers 56, 58 of FIG. 5 via the DATA input line. Although the programmable array of the illustrated embodiment is used to store parametric trim data, those skilled in the art should further appreciate that the array may store data for a variety of different applications.

It should further be appreciated that the memory cell can be implemented using other MOS processes, such as CMOS, in addition to the BiCMOS process of the illustrated embodiment.

Having described a preferred embodiment of the invention, it will be apparent to one of skill in the art that other embodiments incorporating its concepts may be used. Accordingly, the invention should be limited only by the spirit and scope of the appended claims.

I claim:

1. A non-volatile memory cell for an integrated circuit, said memory cell comprising a metal oxide semiconductor field effect transistor (MOSFET) fabricated to read back a first logic level and comprising:

a substrate, a drain diffused into said substrate, a source diffused into said substrate, a substrate channel disposed between a channel edge of said drain and a channel edge of said source;

an insulating oxide layer disposed over said substrate doped with said drain and said source, said insulating layer having a predetermined thickness sufficient to prevent a gate oxide rupture from occurring during cell programming; and a polysilicon gate deposited into said insulating oxide layer over said substrate channel;

wherein said drain further includes (i) a contact region connected to a conductor on which a programming voltage is provided during cell programming, and (ii) an elongated section disposed between said drain channel edge and said contact region so as to provide a predetermined ballast resistance effective to regulate the magnitude of programming current to a desired value when said programming voltage is applied to said conductor.

2. The memory cell of claim 1, wherein said integrated circuit is a BiCMOS integrated circuit.

3. The memory cell of claim 1, wherein said integrated circuit is a CMOS integrated circuit.

4. The memory cell of claim 1, wherein said MOSFET is an n-type MOSFET.

5. The memory cell of claim 4 wherein said bias voltage is approximately 5 volts referenced to said source.

6. The memory cell of claim 4 wherein said programming voltage is approximately 15 volts referenced to said source.

7. The memory cell of claim 1, wherein said MOSFET is a p-type MOSFET.

8. The memory cell of claim 7 wherein said bias voltage is approximately −5 volts referenced to said source.

9. The memory cell of claim 7 wherein said programming voltage is approximately −15 volts referenced to said source.

10. The memory cell of claim 1 wherein said predetermined programming period is between 200 and 500 milliseconds.

11. The memory cell of claim 1 wherein said ohmic path is less than 500K ohms.

12. The memory cell of claim 1 wherein said predetermined drain pattern is a blunted and notched "V" shape.

13. The memory cell of claim 1 wherein said predetermined insulating oxide layer thickness is between 400 and 600 Angstroms.

14. The memory cell of claim 1, wherein a bias current having a predetermined value is routed into said gate causing a voltage to be developed at said gate indicating whether said memory cell is programmed to said first logic level or said second logic level.

15. The memory cell of claim 14 wherein said bias current is approximately 10 microamperes.

16. A programmable array of non-volatile memory cells for an integrated circuit comprising:

a plurality of non-volatile memory cells, each cell comprising a metal oxide semiconductor field effect transistor (MOSFET) fabricated to read back a first logic level and having a drain, a source and a gate;

a series pair of switching devices connected between said gate and a bias voltage for placing said bias voltage onto said gate when enabled so that said gate fuses to said drain when a programming voltage is applied to said drain for a predetermined amount of time and permanently programs said MOSFET to read back a second logic level instead of said first logic level; and a parallel pair of switching devices connected between said source and said gate for shunting said gate to said source when enabled to inhibit said fusing of said gate to said drain;

a column selector circuit generating a column select signal for each column of cells, said column select signal controlling a first device of said series pair of switching devices in cells of a corresponding column of cells and an inverse of said column select signal controlling a second device of said parallel pair of switching devices in cells of a corresponding column of cells; and a row selector circuit generating a row select signal for each row of cells, an inverse of said row select signal controlling a first device of said parallel pair of switching devices in cells of a corresponding row of cells and said row select signal controlling a second device of said series pair of switching devices in cells of a corresponding row of cells.

17. The programmable array of claim 16 wherein said series pair of switching devices are connected between said gate and a source of bias current, said bias current having a predetermined value, said series pair of switching devices routing said bias current into said gate when both of said series pair of switching devices are enabled, said bias current causing a voltage to be developed at said gate indicating whether said MOSFET is programmed to said first logic level or said second logic level.

18. An integrated circuit comprising:

a programmable array comprising:

a plurality of non-volatile memory cells, each cell comprising:

a metal oxide semiconductor field effect transistor (MOSFET) fabricated to read back a first logic level and having a drain, a source and a gate;

a series pair of switching devices connected between said gate and a bias voltage for placing said bias voltage onto said gate when enabled so that said gate fuses to said drain when a programming voltage is applied to said drain for a predetermined amount of time and permanently programs said MOSFET to read back a second logic level instead of said first logic level; and a parallel pair of switching devices connected between said source and said gate for shunting said gate to said source when enabled to inhibit said fusing of said gate to said drain;

a column selector circuit generating a column select signal for each column of cells, said column select signal controlling a first device of said series pair of switching devices in cells of a corresponding column of cells and an inverse of said column select signal controlling a second device of said parallel pair of switching devices in cells of a corresponding column of cells; and a row selector circuit generating a row select signal for each row of cells, an inverse of said row select signal controlling a first device of said parallel pair of switching devices in cells of a corresponding row of cells and said row select signal controlling a second device of said series pair of switching devices in cells of a corresponding row of cells; and one or more circuit blocks, each block performing an assigned function and having a holding shift register, said holding shift registers of said blocks being connected in series, wherein said holding registers may be used to hold bias voltage information for the programmable array prior to array programming or may be used to hold logic state information of the programmable array after array programming.

19. The integrated circuit of claim 18 wherein said series pair of switching devices are connected between said gate and a source of bias current, said bias current having a predetermined value, said series pair of switching devices routing said bias current into said gate when both of said series pair of switching devices are enabled, said bias current causing a voltage to be developed at said gate indicating whether said MOSFET is programmed to said first logic level or said second logic level.

* * * * *

UNITED STATES PATENT AND TRADEMARK OFFICE
CERTIFICATE OF CORRECTION

PATENT NO. : 6,229,733 B1
DATED : May 8, 2001
INVENTOR(S) : Barry Male

Page 1 of 1

It is certified that error appears in the above-identified patent and that said Letters Patent is hereby corrected as shown below:

<u>Column 2,</u>
Line 12, "FIG. is" should read -- FIG. 1 is --.

Signed and Sealed this

Seventh Day of May, 2002

Attest:

*Attesting Officer*

JAMES E. ROGAN
*Director of the United States Patent and Trademark Office*